(12) United States Patent
Glenn et al.

(10) Patent No.: US 6,399,463 B1
(45) Date of Patent: Jun. 4, 2002

(54) METHOD OF SINGULATION USING LASER CUTTING

(75) Inventors: Thomas P. Glenn, Gilbert; Steven Webster; Roy Dale Hollaway, both of Chandler, all of AZ (US)

(73) Assignee: Amkor Technology, Inc., Chandler, AZ (US)

( * ) Notice: Subject to any disclaimer, the term of this patent is extended or adjusted under 35 U.S.C. 154(b) by 0 days.

(21) Appl. No.: 09/797,756

(22) Filed: Mar. 1, 2001

(51) Int. Cl.[7] .................. H01L 21/46; H01L 21/78; H01L 21/301
(52) U.S. Cl. .......... 438/463; 438/113; 438/114; 438/460; 438/462; 438/465
(58) Field of Search ................ 438/460, 462, 438/463, 465, 113, 114

(56) References Cited

U.S. PATENT DOCUMENTS 5,362,681 A    11/1994  Roberts, Jr. et al. ........ 437/226
6,136,668 A  * 10/2000  Tamaki et al. .............. 438/462
6,245,596 B1 *  6/2001  Kosaki et al. .............. 438/114

* cited by examiner

Primary Examiner—John F. Niebling
Assistant Examiner—David A Zarneke
(74) Attorney, Agent, or Firm—Gunnison, McKay & Hodgson, L.L.P.; Philip J. McKay

(57) ABSTRACT

A wafer is singulated from the back-side surface of the wafer using laser ablation, thus protecting the front-side surface of the wafer and, more particularly, the integrated circuits and/or functional units on the front-side surface. Since, according to the invention, no saw blade is used, the width of the scribe lines does not need to be any larger than the width of the beam from the laser plus some minimal tolerance for alignment. As a result, using the invention, the width of scribe lines is on the order of twenty-four times smaller than the width of scribe lines required by the prior art methods.

8 Claims, 5 Drawing Sheets

METHOD OF SINGULATION USING LASER CUTTING

FIELD OF THE INVENTION

The present invention relates generally to electronic components and electronic component packaging. More particularly, the present invention relates to a method of singulating electronic components from a wafer.

BACKGROUND OF THE INVENTION

As is well known to those of skill in the art, integrated circuits, i.e., electronic components, are fabricated in an array on a wafer. The wafer is then cut, sometimes called diced, to singulate the integrated circuits from one another.

The surface of a wafer that includes the circuitry or other functional components is called the "front-side" or "first surface" of a wafer and the opposite surface of the wafer, the surface that has no functional components or circuitry, is called the "back-side" or "second surface" of the wafer. In the prior art, individual integrated circuits were singulated from wafers using either front-side or back-side cutting.

FIG. 1 is a cross-sectional view of a section of a wafer 10 being cut from a front-side surface 10F of wafer 10 in accordance with the prior art using front-side singulation methods. According to prior art front-side singulation methods, integrated circuits 12 were formed in wafer 10 and were delineated by scribe lines 14, which included a first scribe line 14A and a second scribe line 14B, on front-side surface 10F of wafer 10. Scribe lines 14 were formed by methods well known to those of skill in the art. For example, scribe lines 14 were often formed by selective etching of a silicon oxide layer 18 on front-side surface 10F.

To illustrate, first scribe line 14A delineated a first integrated circuit 12A from a second integrated circuit 12B. As shown in FIG. 1, each scribe line 14 had a width WF.

According to prior art front-side singulation methods, a back-side surface 10B of wafer 10 was attached to a tape 20. Wafer 10 was then sawed completely through with a saw blade 22. Saw blade 22 was aligned with scribe lines 14 using an optical alignment system in a well-known manner. In this manner, integrated circuits 12 were singulated. According to prior art methods, tape 20 was used to support wafer 10 during sawing and to support the singulated integrated circuits 12 after sawing was complete.

Using prior art front-side singulation methods, width WF of scribe lines 14 had to be sufficiently large to accommodate: the width of saw blade 22; the inexact positioning and alignment of saw blade 22; the mechanical wobbling of saw blade 22; and the uneven or rough surfaces resulting from the mechanical nature of the cutting using saw blade 22. Stated another way, width WF of scribe lines 14 had to be large enough that the saw cut made by saw blade 22 was always within a scribe line 14. For example, saw blade 22 is within scribe line 14B in FIG. 1.

The optical alignment system of the prior art used scribe lines 14 directly to align saw blade 22 and saw blade 22 was aligned to scribe lines 14 to within a mechanically mandated tolerance. To accommodate this tolerance, and the other factors discussed above that are associated with any sawing processes, scribe lines 14 were made significantly wider than saw blade 22. To illustrate, the typical width of saw blade 22 was between 0.001 inches (0.026 mm) and 0.002 inches (0.051 mm) while width WF of scribe line 14 was typically within the range of 0.003 inches (0.077 mm) to 0.008 inches (0.203 mm).

Disadvantageously, forming scribe lines 14 with relatively large widths WF resulted in less integrated circuits 12 for any given size wafer 10 than could be formed with smaller, more optimal, scribe line widths. This was because larger widths WF meant scribe lines 14 took up more wafer surface 10F area. This, in turn, meant more wasted wafer surface 10F area and less surface 10F area available for integrated circuits 12. Consequently, the integrated circuit 12 yield per wafer 10 decreased. As a result, the cost of each integrated circuit 12 from wafer 10 was increased. Unfortunately, in today's highly competitive markets it is very important to minimize the cost of each integrated circuit 12 to remain competitive.

In certain instances, such as integrated circuits that include micro-machines or other delicate functional components, it is important to protect the front-side surface of the wafer during sawing from the pressure and shards and particulates generated during sawing. In these instances, prior art back-side singulation methods were used to saw the wafer from the back-side surface of the wafer. However, using prior art back-side singulation methods required even larger scribe line widths and resulted in even lower integrated circuit yield per wafer.

FIG. 2 is a cross-sectional view of a section of a wafer 30 being cut from a back-side surface 30B of wafer 30 in accordance with the prior art. To protect a front-side surface 30F of wafer 30, front-side surface 30F was attached to a tape 32. Tape 32 supported wafer 30 during sawing.

Saw blade 22 was aligned with scribe lines 14-1 on front-side surface 30F of wafer 30 using a two-step process. First, tape 32 was aligned with scribe lines 14-1. Then, front-side surface 30F was attached to tape 32. Tape 32 had a surface area greater than the area of front-side surface 30F such that tape 32 had an exposed region, which extended beyond wafer 30. Tape 32 had alignment marks in the exposed region of tape 32. As an example, see alignment holes 30a and 30b of Roberts, Jr. et al., U.S. Pat. No. 5,362,681, which is herein incorporated by reference in its entirety. In the above manner, scribe lines 14-1 were aligned with the alignment marks of tape 32.

Second, saw blade 22 was aligned with the alignment marks of tape 32. Wafer 30 was then sawed with saw blade 22 from back-side surface 30B. However, since saw blade 22 was aligned indirectly to scribe lines 14-1 using alignment marks of tape 32, a large tolerance, associated with the alignment of saw blade 22 to scribe lines 14-1, was required.

To accommodate this large tolerance, each of scribe lines 14-1 had a relatively large width WB. More particularly, referring now to FIGS. 1 and 2 together, width WB of scribe lines 14-1 of wafer 30, that was designed to be cut from back-side surface 30B, was significantly larger than width WF of scribe lines 14 of wafer 10, which was designed to be cut from front-side surface 10F. To illustrate, width WB was typically at least 0.012 inches (0.305 mm), and often even larger.

As with scribe line 14 discussed above, forming scribe lines 14-1 with relatively large widths WB resulted in less integrated circuits 12 for any given size wafer 30. In the particular case of scribe lines 14-1 on wafer 30 in FIG. 2, the scribe lines 14-1 are even thicker than scribe lines 14 in FIG. 1 and the number of integrated circuits 12 is even less than the corresponding number of integrated circuits 12 formed in the same size wafer 10 in FIG. 1. Consequently, using prior art back-side cutting as shown in FIG. 2 resulted in an even smaller yield of integrated circuits 12 from wafer 30. As a result, the cost of each integrated circuit 12 from wafer 30 was even greater than the cost of each integrated circuit 12 from wafer 10.

As discussed above, both front-side and back-side prior art methods of singulation wasted large amounts of wafers 10 and 30. This waste was necessary, using prior art methods, in order to create scribe lines 14 and 14-1 with widths WF and WB large enough to accommodate: the width of saw blade 22; the inexact positioning and alignment of saw blade 22; the mechanical wobbling of saw blade 22; and the uneven or rough surfaces resulting from the mechanical nature of cutting using saw blade 22.

As also discussed above, forming scribe lines 14 or 14-1 with relatively large widths WF and WB, as required in the prior art, resulted in less integrated circuits 12 for any given size wafer 10 or 30. As a result, the cost of each integrated circuit 12 from wafer 10 or 30 was greater than optimal. This was particularly true when prior art back-side singulation methods were used.

In addition, both the prior art front-side and back-side sigulation processes discussed above include cutting completely through wafer 10 and 30 to singulate integrated circuits 12. Consequently, each integrated circuit 12 must be further processed, shipped and wrapped separately, thus driving up the cost of each integrated circuit 12, increasing the probability of defective units by increasing handling operations and driving down the efficiency of the process.

What is needed is a method for singulating integrated circuits from wafers that does not require the large width scribe lines of prior art methods and therefore increases the yield per wafer and decreases the cost per integrated circuit.

SUMMARY OF THE INVENTION

As discussed above, using prior art methods of back-side singulation, scribe lines had to have widths large enough to accommodate: the width of saw blade; the inexact positioning and alignment of saw blade; the mechanical wobbling of saw blade; and the uneven or rough surfaces resulting from the mechanical nature of cutting a using saw blade. As also discussed above, forming the scribe lines with relatively large widths resulted in less integrated circuits for any given size wafer, i.e., a loss of yield. This resulted in a substantial increase in the cost of the integrated circuits.

As discussed in more detail below, according to one embodiment of the invention, a wafer is cut from the back-side surface of the wafer, thus protecting the front-side surface of the wafer and, more particularly, the integrated circuits and/or functional units. However, advantageously, and in direct contrast to the prior art, back-side singulation according to the invention is preformed by a laser. Consequently, according to the invention, no saw blade is used and the width of the scribe lines does not need to be large enough to accommodate: the width of saw blade; the inexact positioning and alignment of saw blade; the mechanical wobbling of saw blade; and the uneven or rough cutting surfaces left by saw blade. Stated another way, using the invention, the width of the scribe lines does not need to be any larger than the width of the beam from the laser plus some minimal tolerance for alignment. Consequently, using the invention, scribe lines typically have widths between 0.0005 inches (0.013 mm) and 0.001 inches (0.026 mm).

This is in stark contrast to the prior art methods of back-side singulation which required scribe lines with widths of at least 0.012 inches (0.305 mm), and often even larger. As a result, using the invention, the width of scribe lines is on the order of twenty-four times smaller than the width of scribe lines required by the prior art methods; a 2400% decrease. Therefore, using the invention, the wafer is cut from back-side surface and the integrated circuits of wafer are protected during singulation while, at the same time, there is minimal waste of wafer and the cost per integrated circuit is significantly lowered.

Equally impressive is the fact that, using the present invention, the width of the scribe lines is six to fourteen times smaller than the width of the scribe lines required using prior art front-side singulation methods. Consequently, the invention is well suited to front-side singulation and represents a significant improvement over prior art front-side singulation methods as well.

In addition, unlike the prior art front-side and back-side sigulation processes discussed above, the method and structure of the invention does not include cutting completely through the wafer to singulate the integrated circuits. Consequently, each integrated circuit can be further processed, shipped and wrapped in a wafer array, thus driving down the cost of each integrated circuit, decreasing the probability of defective units by decreasing handling operations and driving up the efficiency of the process.

In accordance with one embodiment of the present invention, a method includes providing a substrate, the substrate including a substrate first surface and a substrate second surface, opposite the substrate first surface, and a substrate thickness between the substrate first surface and the substrate second surface.

A scribe line is then formed on the substrate first surface, the scribe line including a scribe line width extending in a first direction on the substrate first surface and a scribe line length extending in a second direction, perpendicular to the first direction, on the substrate first surface, the scribe line delineating a first region of the substrate from a second region of the substrate on the substrate first surface.

A laser beam is then aligned on the substrate second surface such that the laser beam is aligned on the substrate second surface with the scribe line on the substrate first surface. A trench is then created in the substrate using the laser.

According to the invention, the trench includes: a trench opening at the substrate second surface, the trench opening including a trench opening width extending in the first direction along the substrate second surface; a trench depth extending from the trench opening to a trench bottom located at a trench bottom position within the substrate, the trench bottom including a trench bottom width extending in the first direction at the trench bottom position within the substrate; first and second trench sides extending from the trench opening to the trench bottom; a trench length extending in the second direction on the substrate second surface and being at least partially coextensive with the scribe line length on the substrate first surface such that the trench is positioned below the scribe line within the substrate and the trench delineates the first region of the substrate from the second region of the substrate on the substrate second surface.

The first region of the substrate is then singulated from the second region of the substrate along the trench.

In accordance with a second embodiment of the present invention, a method includes providing a substrate, the substrate including a substrate first surface and a substrate second surface, opposite the substrate first surface, and a substrate thickness between the substrate first surface and the substrate second surface. A scribe line is then formed on the substrate first surface, the scribe line including a scribe line width extending in a first direction on the substrate first surface and a scribe line length extending in a second direction, perpendicular to the first direction, on the substrate first surface, the scribe line further including a scribe line depth extending into the substrate first surface and a scribe line bottom surface, the scribe line delineating a first region of the substrate from a second region of the substrate on the substrate first surface.

A reflective layer is formed on the scribe line bottom surface. A laser scribe machine is then aligned on the substrate second surface such that a laser beam from the laser scribe machine is aligned on the substrate second surface with the scribe line on the substrate first surface.

A portion of the substrate is then ablated from the substrate second surface using the laser beam, the laser beam ablating the portion of the substrate until the laser beam contacts the reflective layer on the scribe line bottom surface and the laser beam light is reflected from the reflective layer on the scribe line bottom surface. Power to the laser beam is then removed when the laser beam light is reflected from the reflective layer on the scribe line bottom surface, thereby ceasing the ablation of the substrate. In this way, the ablation of the portion of the substrate creates a trench in the substrate second surface.

According to the invention, the trench includes: a trench opening at the substrate second surface, the trench opening including a trench opening width extending in the first direction along the substrate second surface; a trench depth extending from the trench opening to a trench bottom, the trench bottom including a portion of the reflective layer on the scribe line bottom surface, the trench bottom including a trench bottom width extending in the first direction at the reflective layer of the scribe line bottom surface; first and second trench sides extending from the trench opening to the trench bottom; a trench length extending in the second direction on the substrate second surface and being at least partially coextensive with the scribe line length on the substrate first surface such that the trench is positioned below the scribe line within the substrate and the trench delineates the first region of the substrate from the second region of the substrate on the substrate second surface.

The first region of the substrate is then singulated from the second region of the substrate along the trench.

In accordance with a third embodiment of the present invention, a method includes providing a substrate, the substrate including a substrate first surface and a substrate second surface, opposite the substrate first surface, and a substrate thickness between the substrate first surface and the substrate second surface.

A scribe line is then formed on the substrate first surface, the scribe line including a scribe line width extending in a first direction on the substrate first surface and a scribe line length extending in a second direction, perpendicular to the first direction, on the substrate first surface, the scribe line delineating a first region of the substrate from a second region of the substrate on the substrate first surface.

A laser beam is then aligned on the substrate second surface such that the laser beam is aligned on the substrate second surface with the scribe line on the substrate first surface. A trench is then created in the substrate using the laser.

A portion of the substrate is then ablated from the substrate second surface by applying the laser beam to the substrate second surface, thereby creating a trench in the substrate.

According to the invention, the trench includes: a trench opening at the substrate second surface, the trench opening including a trench opening width extending in the first direction along the substrate second surface; a trench depth extending from the trench opening o a trench bottom point located at a trench bottom position within the substrate; first and second trench sides extending from the trench opening to the trench bottom point, such that the trench has a cross section which is approximately triangular in shape; a trench length extending in the second direction on the substrate second surface and being at least partially coextensive with the scribe line length on the substrate first surface such that the trench is positioned below the scribe line within the substrate and the trench delineates the first region of the substrate from the second region of the substrate on the substrate second surface.

The first region of the substrate is then singulated from the second region of the substrate along the trench.

In accordance with a fourth embodiment of the present invention, a method includes providing a substrate, the substrate including a substrate first surface and a substrate second surface, opposite the substrate first surface, and a substrate thickness between the substrate first surface and the substrate second surface.

A scribe line is then formed on the substrate first surface, the scribe line including a scribe line width extending in a first direction on the substrate first surface and a scribe line length extending in a second direction, perpendicular to the first direction, on the substrate first surface, the scribe line delineating a first region of the substrate from a second region of the substrate on the substrate first surface.

The substrate first surface is then optically scanned to locate the scribe line and determine a position of the scribe line. A first location on the substrate second surface is then marked with a first alignment mark by aiming a laser at the first location and firing the laser. The first alignment mark is then used to determine a position of the scribe line and align a laser beam with the scribe line using the alignment mark such that the laser beam is aligned on the second surface of the substrate with the scribe line on the first surface of the substrate. A trench is then created in the substrate using the laser.

According to the invention, the trench includes: a trench opening at the substrate second surface, the trench opening including a trench opening width extending in the first direction along the substrate second surface; a trench depth extending from the trench opening to a trench bottom located at a trench bottom position within the substrate, the trench bottom including a trench bottom width extending in the first direction at the trench bottom position within the substrate; first and second trench sides extending from the trench opening to the trench bottom; a trench length extending in the second direction on the substrate second surface and being at least partially coextensive with the scribe line length on the substrate first surface such that the trench is positioned below the scribe line within the substrate and the trench delineates the first region of the substrate from the second region of the substrate on the substrate second surface.

The first region of the substrate is then singulated from the second region of the substrate along the trench.

In accordance with a third embodiment of the present invention, a method includes providing a wafer, the wafer including a wafer first surface and a wafer second surface, opposite the wafer first surface, and a wafer thickness between the wafer first surface and the wafer second surface. A plurality of scribe lines is then formed on the wafer first surface, each of the scribe lines including a scribe line width extending in a first direction on the wafer first surface and a scribe line length extending in a second direction, perpendicular to the first direction, on the wafer first surface, the plurality of scribe lines delineating a plurality of regions on the wafer first surface.

A laser beam is then aligned on the wafer second surface such that the laser beam is aligned on the wafer second surface with one scribe line of the plurality of scribe lines on the wafer first surface. A trench is then created in the wafer second surface using the laser.

According to the invention the trench includes: a trench opening at the wafer second surface, the trench opening including a trench opening width extending in the first direction along the wafer second surface; a trench depth extending from the trench opening to a trench bottom located at a trench bottom position within the wafer, the trench bottom including a trench bottom width extending in the first direction at the trench bottom position within the wafer; first and second trench sides extending from the trench opening to the trench bottom; a trench length extending in the second direction on the wafer second surface and being at least partially coextensive with the scribe line length on the wafer first surface such that the trench is positioned below the scribe line within the wafer.

Then the aligning of the laser beam on the wafer second surface and creating a trench in the wafer second surface is repeated for each one of the plurality of scribe lines on the wafer first surface such that a plurality of trenches are created delineating a plurality of regions on the wafer second surface.

The plurality of regions are then singulated from the wafer along the trenches.

BRIEF DESCRIPTION OF THE DRAWINGS

In the following description, the same or similar elements are labeled with the same or similar reference numbers.

DETAILED DESCRIPTION

Figure 3A:
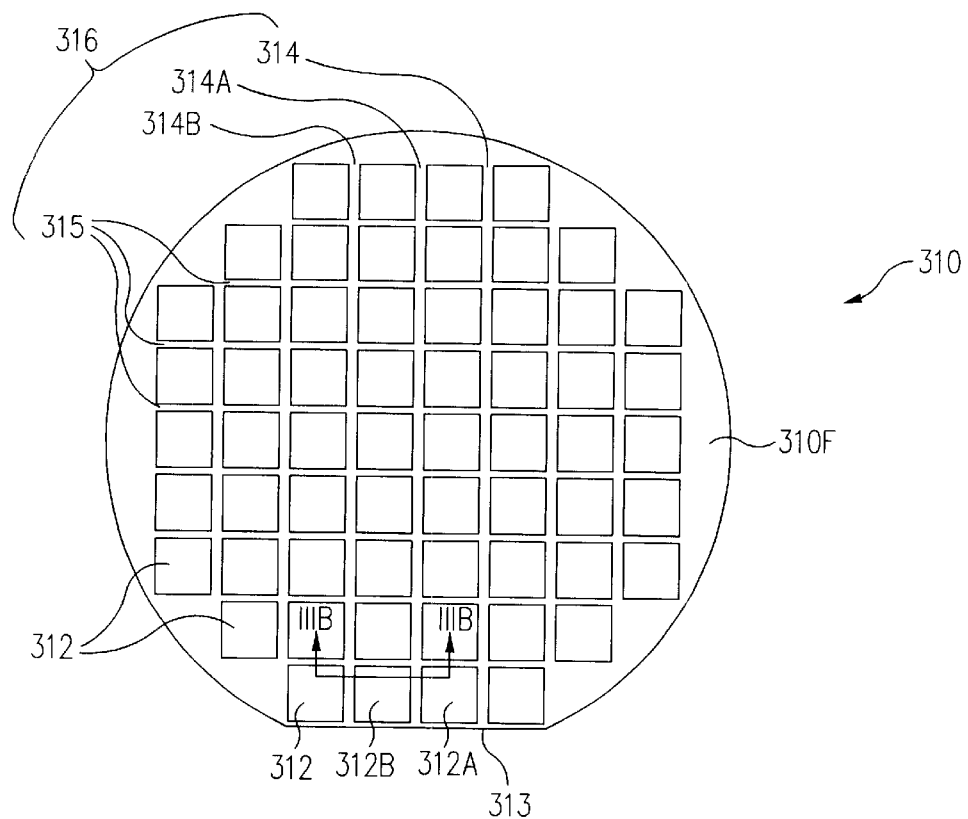
FIG. 3A shows a scribe grid on a front-side surface of a wafer including horizontal scribe lines and vertical scribe lines that define individual integrated circuits.

FIG. 3A shows a scribe grid 316 on a front-side or first surface 310F of a wafer 310. More particularly, FIG. 3A is a top plan view of a wafer 310, e.g., a substrate, in accordance with the present invention. Formed in wafer 310 are integrated circuits 312, generally referred to as electronic components. Although integrated circuits 312 are set forth as the electronic components formed in wafer 310, electronic components such as micro-machine chips or image sensor chips are formed in wafer 310 instead of integrated circuits 312 in other embodiments. For simplicity, integrated circuits 312 are discussed below and illustrated in the figures.

Integrated circuits 312 are delineated by a scribe grid 316, e.g., a reference feature, on a front-side, e.g., first, surface 310F of wafer 310. For example, scribe grid 316 is a silicon oxide layer 311 (FIG. 3B), which has been selectively etched, on front-side surface 310F.

Scribe grid 316 (FIG. 3A) includes a plurality of vertical scribe lines 314 and a plurality of horizontal scribe lines 315, which delineate adjacent integrated circuits 312. Generally, vertical scribe lines 314 extend in a first direction, e.g., vertical in the view of FIG. 3A. Further, horizontal scribe lines 315 extend in a second direction perpendicular to the first direction, e.g., horizontal in the view of FIG. 3A. In this embodiment, wafer 310 includes a flat 313, which is a cut straight edge of wafer 310. Flat 313 extends in the second direction, e.g., horizontal in the view of FIG. 3A. Also shown in FIG. 3A are individual scribe lines 314A and 314B defining integrated circuits 312A and 312B.

Figure 3B:
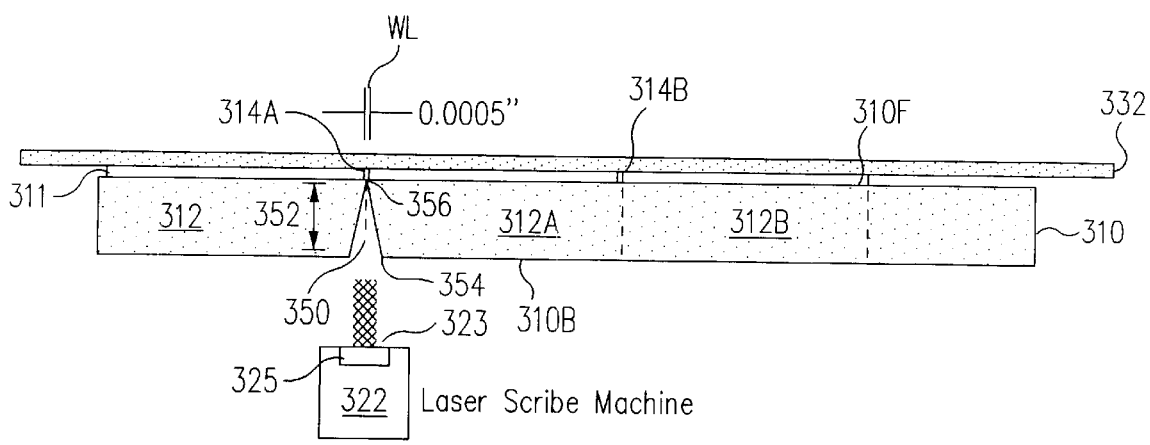
FIG. 3B shows a cross-sectional view of a section of a wafer, as seen along line IIIB—IIIB in FIG. 3A, being singulated from the back-side surface of the wafer according to the principles of the present invention.

FIG. 3B shows a cross-sectional view of a section of wafer 310, as seen along line IIIB—IIIB in FIG. 3A, being cut from back-side or second surface 310B of wafer 310 according to the principles of the present invention. As shown in FIG. 3B, front-side surface 310F of wafer 310 is attached to a tape 332, such as Nitto blue tape, to protect front-side surface 310F of wafer 310 during sigulation.

A laser scribe machine 322 is aligned with a scribe line 314A of scribe grid 316 (see FIG. 3A) using alignment methods well known to those of skill in the art. In one embodiment of the invention, laser scribe machine 322 includes a sensor 325 that receives light reflected from the target, i.e., back-side surface 310B. Laser scribe machines, such as laser scribe machine 322, are well known to those of skill in the art. Consequently, the structure and operation of laser scribe machine 322 will not be discussed in detail herein to avoid detracting from the invention.

In one embodiment of the invention, laser beam 323 is precisely aligned to scribe line 314A using newer methods of alignment such as are set forth in U.S. patent application Ser. No. 09/558,392, entitled "PRECISION MARKING AND SINGULATION METHOD", naming Thomas Glenn et al. as inventors, filed on Apr. 25, 2000 and assigned to the assignee of the present invention, which is incorporated herein by reference. In this embodiment of the invention, alignment of laser scribe machine 322 is very precise and little or no width is added to scribe line 314A to accommodate alignment tolerances. Consequently, the extra large width of the prior art scribe lines, such as width WF of scribe lines 14 on wafer 10 of FIG. 1 and width WB of scribe lines 14-1 wafer 30 of FIG. 2, is not required.

Once laser scribe machine 322 is aligned, Wafer 310 is cut from back-side surface 310B along scribe line 314A using laser beam 323 of laser scribe machine 322. According to the invention, laser beam 323 cuts or "ablates" a trench 350 from back-side surface 310B of wafer 310 to a predetermined depth 352 within wafer 310. Typically, multiple trenches 350 are created on the back-side surface 310B of wafer 310 and the length (not shown) of each trench 350 runs the entire usable length, or width, of the back-side surface 310B of wafer 310 at the position of the trench. In one embodiment of the invention, trenches 350 are formed under scribe lines 314 and 315, on the back-side of wafer 310, and therefore trenches 350 have lengths approximately equal to, and at least partially coextensive with, the lengths of scribe lines 314 and 315. As discussed in more detail below, the depth 352 of trench 350 varies from application to application. The value for depth 352 can be controlled by selecting the appropriate power setting and time of application for laser beam 323 of laser scribe machine 322.

As can also be seen in FIG. 3B, in one embodiment of the invention, trench 350 is roughly triangular, having a relatively wide base, or trench opening length, 354 and an apex point 356. As discussed below, this shape has several advantages.

As discussed above, in certain instances, it is important to cut the wafer from the back-side surface. However, using prior art methods, scribe lines 14-1 had to have widths WB large enough to accommodate: the width of saw blade 22; the inexact positioning and alignment of saw blade 22; the mechanical wobbling of saw blade 22; and the uneven or rough surfaces resulting from the mechanical nature of cutting using saw blade 22 (see FIG. 2). Also recall that the width WB of scribe lines 14-1 had to be particularly large to accommodate the particularly imprecise alignment of saw blade 22 using prior art methods. Disadvantageously, forming the scribe lines 14-1 with a relatively large width WB resulted in less integrated circuits for any given size wafer, i.e., a loss of yield. This resulted in a substantial increase in the cost of the integrated circuits.

According to one embodiment of the invention, wafer 310 (FIG. 3B) is cut from back-side surface 310B, thus protecting front-side surface 310F of wafer 310 and, more particularly, integrated circuits 312, 312A and 312B. However, advantageously, and in direct contrast to the prior art, back-side singulation according to the invention is preformed by laser beam 323 of laser scribe machine 322. Consequently, according to the invention, no saw blade is used and the width WL of scribe lines 314, 314A and 314B does not need to be large enough to accommodate: the width of saw blade 22; the inexact positioning and alignment of saw blade 22; the mechanical wobbling of saw blade 22; and the uneven or rough cutting surfaces left by saw blade 22. Stated another way, width WL of scribe lines 314, 314A and 314B of the invention does not need to be any larger than the width of laser beam 323 plus some minimal tolerance for alignment.

In addition, as discussed above, the tolerance for alignment can be further reduced using the newer methods of alignment set forth in U.S. patent application Ser. No. 09/558,392, entitled "PRECISION MARKING AND SINGULATION METHOD", naming Thomas Glenn et al. as inventors, filed on Apr. 25, 2000 and assigned to the assignee of the present invention, which is incorporated herein by reference. Consequently, using the invention, scribe lines 314, 314A and 314B typically have widths WL between 0.0005 inches (0.013 mm) and 0.001 inches (0.026 mm).

This is in stark contrast to the prior art methods of back-side cutting which required scribe lines 14-1 with widths WB of at least 0.012 inches (0.305 mm), and often even larger (FIG. 2). As a result, using the invention, width WL of scribe lines 314, 314A and 314B is on the order of twenty-four times smaller than the width WB of scribe lines 14-1 in the prior art; a 2400% decrease. Therefore, using the invention, wafer 310 is cut from back-side surface 310B and integrated circuits 312 of wafer 310 are protected during singulation, while, at the same time, there is minimal waste of wafer 310 and the cost per integrated circuit 312 is significantly lower than of the cost per integrated circuit using prior art back-side singulation methods.

Figure 1:
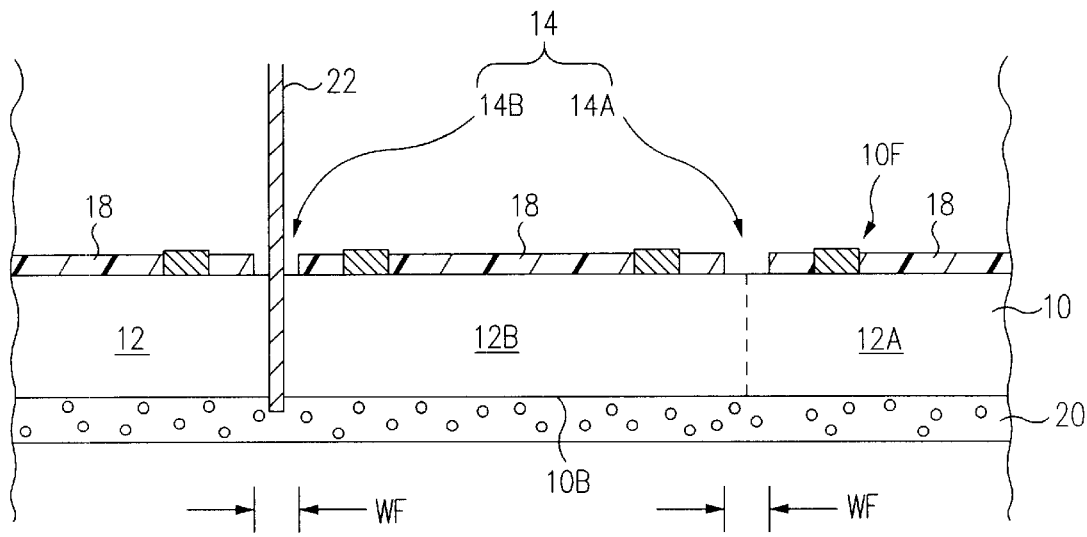
FIG. 1 is a cross-sectional view of a section of a wafer being cut from a front-side surface of the wafer in accordance with the prior art.
Figure 2:
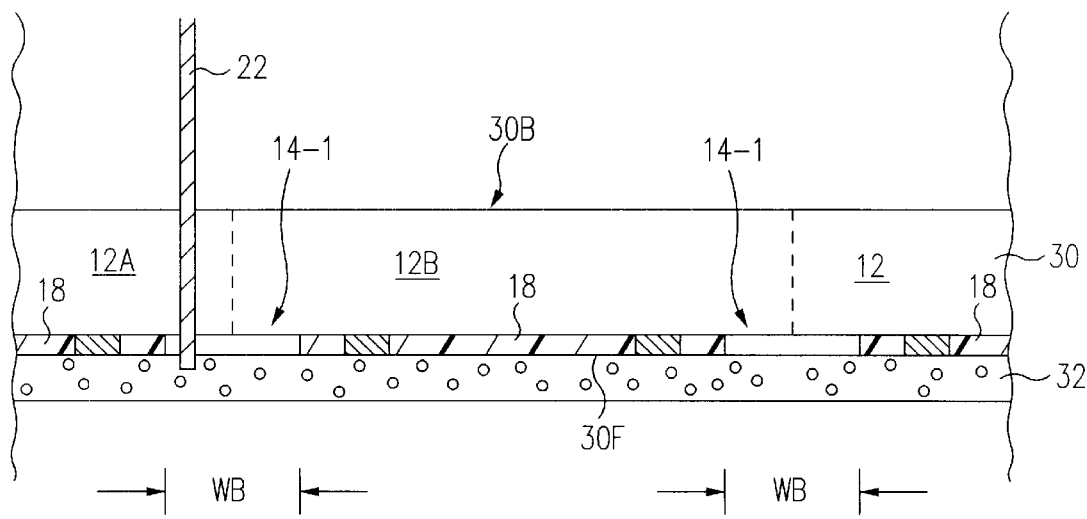
FIG. 2 is a cross-sectional view of a section of a wafer being cut from a back-side surface of the wafer in accordance with the prior art.

Equally impressive is the fact that, using the present invention, the width WL of scribe lines 314, 314A and 314B is six to fourteen times smaller than the width WF of scribe lines 14 required using prior art front-side singulation methods (FIG. 1). Consequently, the invention is well suited to front-side singulation and represents a significant improvement over prior art front-side singulation methods as well.

Figure 4:
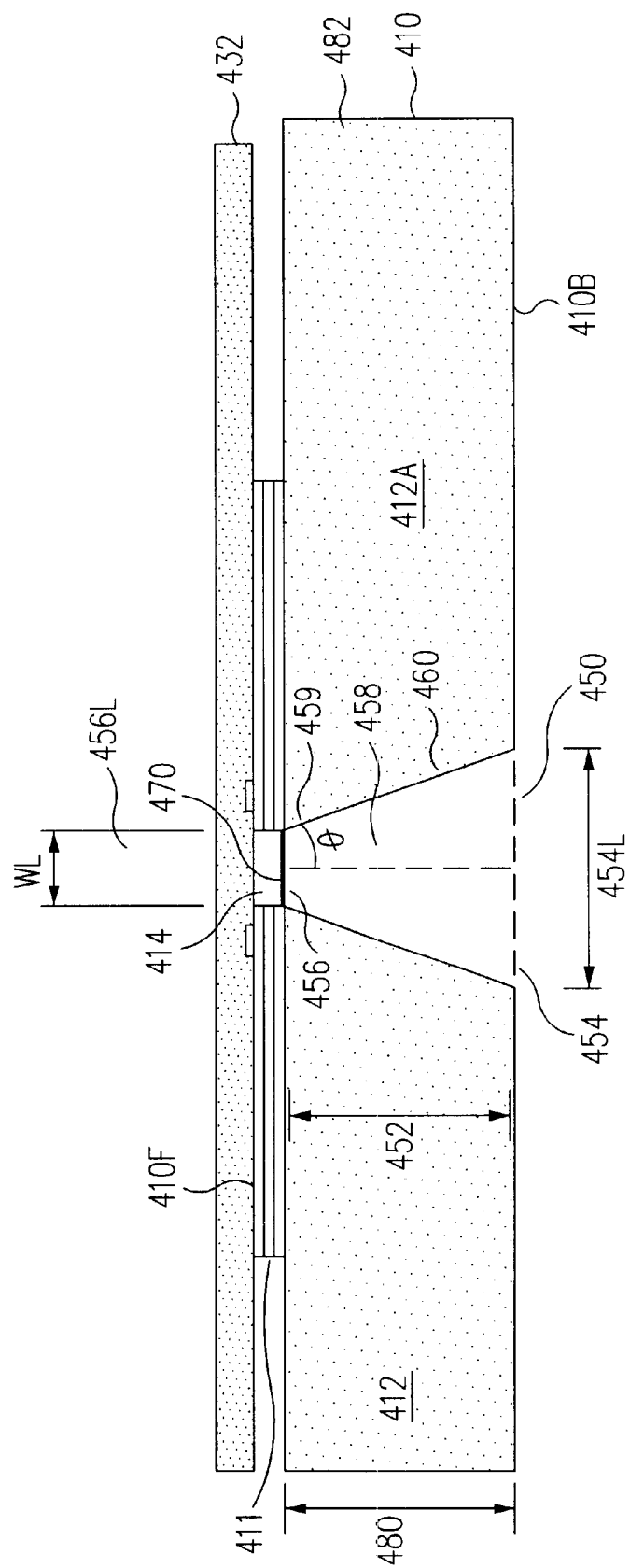
FIG. 4 shows a cross-sectional view of a section of wafer after having a trench ablated from the back-side surface of the wafer according to the principles of one embodiment of the present invention.

FIG. 4 shows a cross-sectional view of a section of wafer 410 after having a trench 450 ablated from back-side of second surface 410B according to one embodiment of the present invention. Integrated circuits 412 and 412A are embedded in wafer 410 on front-side or first surface 410F and include circuitry and/or functional elements. Integrated circuits 412 and 412A are delineated by a scribe line 414 on front-side 410F, e.g., first surface 410F, of wafer 410. In one embodiment of the invention, scribe line 414 is a silicon oxide layer 411 that has been selectively etched on front-side surface 410F.

In the embodiment of the invention shown in FIG. 4, scribe line 414, includes a metallic, or otherwise highly reflective, layer 470. Metallic layer 470 is typically aluminum, titanium, chrome, nickel, gold or any other highly reflective material. In one embodiment of the invention, metallic layer 470 is formed by depositing a layer of metal at the bottom of scribe line 414 after scribe line 414 is etched or otherwise formed. In another embodiment, metallic layer 470 is formed when wafer 410 is formed and scribe line 414 is etched down to the underlying metallic layer 470. Methods for depositing and/or forming a metallic layer, such as metallic layer 470, are well known to those of skill in the art. Consequently, the methods of forming metallic layer 470 are not discussed in more detail herein to avoid detracting from the invention.

As shown in FIG. 4, front-side surface 410F of wafer 410 is attached to a tape 432, such as Nitto blue tape, to protect front-side surface 410F of wafer 410 during sigulation. As discussed above with respect to FIG. 3B, a laser scribe machine 322 (FIG. 3B) is aligned with scribe line 414 (FIG. 4) using alignment methods well known to those of skill in the art and wafer 410 is cut from back-side surface 410B beneath scribe line 414 using laser beam 323 of laser scribe machine 322 (FIG. 3B). As also discussed above, according to the invention, laser beam 323 cuts or "ablates" trench 450 from back-side surface 410B of wafer 410 to a predetermined depth 452 within wafer 410 (FIG. 4).

In the embodiment of the invention shown in FIG. 4, the depth 452 of trench 450 is approximately equal to the thickness 480 of wafer substrate 482, which is typically in the range of twenty mils to thirty mils. However, the depth 452 of trench 450 can vary from application to application and, in this embodiment, is equal to the depth of metallic layer 470.

In the embodiment of the invention shown in FIG. 4, sensor 325 on laser scribe machine 322 (FIG. 3B) is used to control laser beam 323 and depth 452 of trench 450 (FIG. 4). In this embodiment, sensor 325 (FIG. 3B) measures the light reflected from the laser target, i.e., back-side surface 410B (FIG. 4). When laser beam 323 hits metallic layer 470, the amount of light reflected into sensor 325 increases significantly. This increased level of reflected light is then used to shut off laser beam 323 by either signaling an operator or by triggering a circuit (not shown) on laser scribe machine 322

(FIG. 3B) to cut off power to laser beam 323. Consequently, in the embodiment of the invention shown in FIG. 4, laser beam 323 is applied to back-side surface 410B, and ablates trench 450 in back-side surface 410B, until the metallic layer 470 is reached. In this way, the depth 452 of trench 450 is precisely controlled by controlling the depth of metallic layer 470.

As can also be seen in FIG. 4, in one embodiment of the invention, trench 450 is generally triangular, having a relatively wide base opening 454 with a trench opening width 454L and a narrower trench bottom 456 with a trench bottom length 456L, approximately equal to width WL of scribe line 414. As shown in FIG. 4, the resulting trench 450 has a side 460 that is at an angle 459 to an imaginary line 458 running down the center of trench 450. In one embodiment of the invention, angle 459 is in the range of one to five degrees.

The triangular shape of trench 450 has several advantages. First, the shape allows for a minimal width WL of scribe line 414 since trench 470 comes to narrow trench bottom 456 right at scribe line 414. Second, the triangular shape is well suited to breaking, or snapping apart, individual integrated circuits 412 and 412A. In addition, less wafer 410 material needs to be ablated and this, in turn, means less waste and less power used.

Unlike the prior art front-side and back-side sigulation processes discussed above, the method and structure of the invention does not include cutting completely through wafer 410 to singulate integrated circuits 412 and 412A. Consequently, each integrated circuit 412 can be further processed, shipped and wrapped in a wafer array, thus driving down the cost of each integrated circuit 412, decreasing the probability of defective units by decreasing handling operations and driving up the efficiency of the process.

As discussed above, in certain instances, it is important to cut the wafer from the back-side surface. Recall that, using prior art methods, scribe lines 14-1 had to have widths WB large enough to accommodate: the width of saw blade 22; the inexact positioning and alignment of saw blade 22; the mechanical wobbling of saw blade 22; and the uneven or rough surfaces resulting from the mechanical nature of cutting using saw blade 22 (see FIG. 2). Also recall that the width WB of scribe lines 14-1 had to be particularly large to accommodate the particularly imprecise alignment of saw blade 22 using prior art back-side singulation methods. Disadvantageously, forming the scribe lines 14-1 with a relatively large width WB resulted in less integrated circuits for any given size wafer, i.e., a loss of yield. This resulted in a substantial increase in the cost of the integrated circuits.

According to one embodiment of the invention, wafer 410 (FIG. 4) is cut from back-slide surface 410B, thus protecting front-side surface 410F of wafer 410 and, more particularly, integrated circuits 412 and 412A. However, advantageously, and in direct contrast to the prior art, back-side singulation according to the invention is reformed by laser beam 323 of laser scribe machine 322 (FIG. 3B). Consequently, width WL of scribe line 414 does not need to be any larger than the width of the beam from laser beam 323 plus some minimal tolerance for alignment.

In addition, as discussed above, the tolerance for alignment can be further reduced using the newer methods of alignment set forth in U.S. patent application Ser. No. 09/558,392, entitled "PRECISION MARKING AND SINGULATION METHOD", naming Thomas Glenn et al. as inventors, filed on Apr. 25, 2000 and assigned to the assignee of the present invention, which is incorporated herein by reference.

Consequently, using the invention, scribe line 414 typically has a width WL between 0.0005 inches (0.013 mm) and 0.001 inches (0.026 mm).

This is in stark contrast to the prior art methods of back-side singulation which required scribe lines 14-1 with widths WB of at least 0.012 inches (0.305 mm), and often even larger (FIG. 2). As a result, using the invention, width WL of scribe line 414 (FIG. 4) is on the order of twenty-four times smaller than the width WB of scribe lines 14-1 in the prior art; a 2400% decrease.

Figure 5:
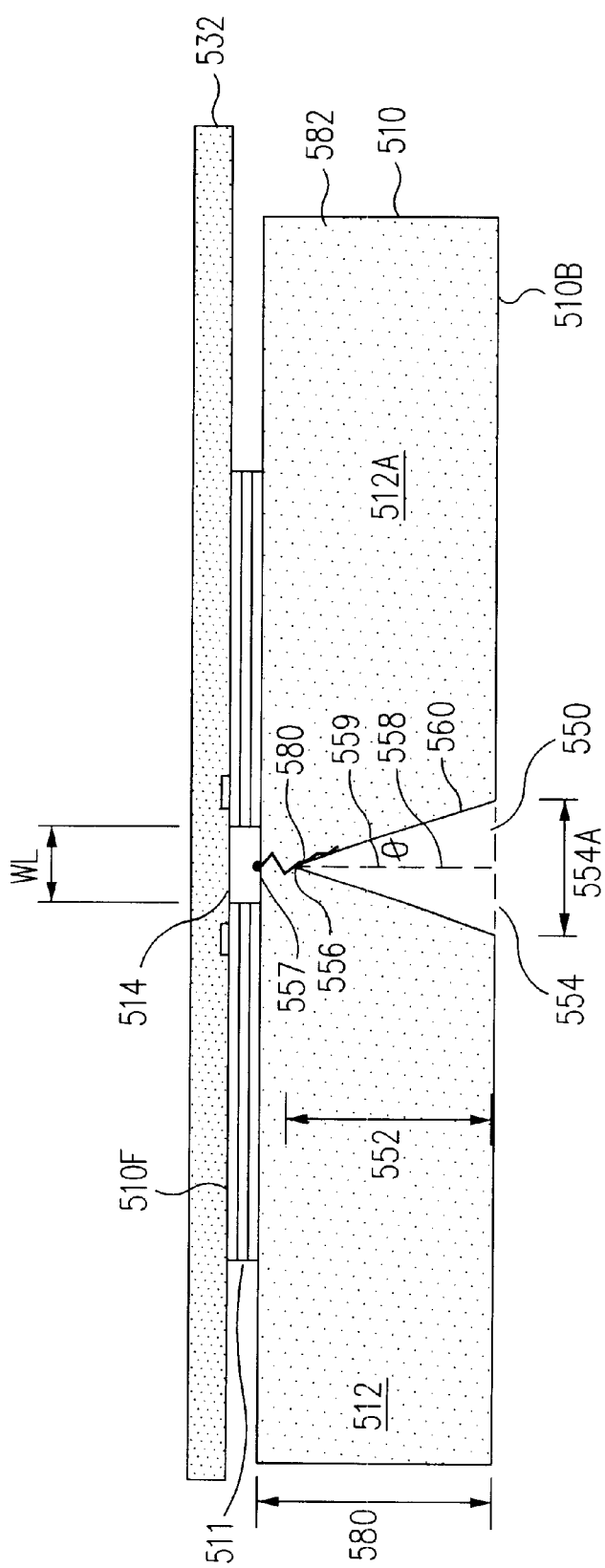
FIG. 5 shows a cross-sectional view of a section of a wafer after having a trench ablated from the back-side surface of the wafer according to the principles of another embodiment of the present invention.

FIG. 5 shows a cross-sectional view of a section of wafer 510 after having a trench 550 ablated from back-side or second surface 510B according to one embodiment of the present invention. Integrated circuits 512 and 512A are embedded in wafer 510 in front-side or first surface 510F and include circuitry and/or functional elements. Integrated circuits 512 and 512A are delineated by a scribe line 514 on front-side surface 510F, e.g., first surface 510F, of wafer 510. In one embodiment of the invention, scribe line 514 is a silicon oxide layer 511 that has been selectively etched on front-side surface 510F.

As shown in FIG. 5, front-side surface 510F of wafer 510 is attached to a tape 532, such as Nitto blue tape, to protect front-side surface 510F of wafer 510 during sigulation. As discussed above with respect to FIG. 3B, a laser scribe machine 322 (FIG. 3B) is aligned with scribe line 514 (FIG. 5) using alignment methods well known to those of skill in the art and wafer 510 is cut from back-side surface 510B beneath scribe line 514 using laser beam 323 of laser scribe machine 322 (FIG. 3B). As also discussed above, according to the invention, laser beam 323 cuts or "ablates" trench 550 from back-side surface 410B of wafer 410 to a predetermined depth 552 within wafer 510 (FIG. 5).

In the embodiment of the invention shown in FIG. 5, the depth 552 of trench 550 is less than the thickness 580 of wafer substrate 582. However, the depth 552 of trench 550 can vary from application to application. In the embodiment of the invention shown in FIG. 5, the time of application and the power level of laser beam 323 on laser scribe machine 322 (FIG. 3B) is set to control laser beam 323 and depth 552 of trench 550 (FIG. 5). In this embodiment, the power level and the time of application of laser beam 323 are pre-selected such that the depth 552 of trench 550 is a predetermined value and trench bottom point 556 of trench 550 is a predetermined distance below point 557 at the bottom of scribe line 514. In one embodiment of the invention depth 552 is twenty mils to thirty mils and trench bottom point 556 lies ten to fifteen thousand angstroms below point 557 at the bottom of scribe line 514. Consequently, in the embodiment of the invention shown in FIG. 5, laser beam 323 is applied to back-side surface 510B, and ablates trench 550, until the depth 552 is the desired value.

As can also be seen in FIG. 5, in one embodiment of the invention, trench 550 is generally triangular, having a relatively wide base opening 554 with trench opening length 554L and an apex or trench bottom point 556. As shown in FIG. 5, the resulting trench 550 has a side 560 that is at an angle 559 to an imaginary line 558 that runs down the center of trench 550. In one embodiment of the invention, angle 559 is in the range of one degree to five degrees.

The triangular shape of trench 550 has several advantages. First, as discussed above, trench bottom point 556 of trench 550 is a predetermined distance below point 557 at the bottom of scribe line 514. Consequently, the structural integrity of wafer 510 can be maintained, i.e., integrated circuits 512 and 512A remain attached, until pressure is applied to scribe line 514, or trench 550, and a crack 580 develops. The triangular shape of trench 550 is well suited to breaking, or snapping apart individual integrated circuits 512 and 512A along scribe line 514 using crack 580.

The ability of wafer 510 to maintain its structural integrity means that, unlike the prior art front-side and back-side sigulation processes, integrated circuits 512 and 512A can be further processed, shipped and wrapped in a wafer array. Consequently using the structure and method of the invention, the cost of each integrated circuit 512 and 512A is decreased, the probability of defective units is decreased, by decreasing handling operations, and the efficiency of the process is increased.

The triangular shape of trench 550 also allows for a minimal width WL of scribe line 514 since trench 570 comes to trench bottom point 556 directly below scribe line 514.

As discussed above, in certain instances, it is important to singulate the wafer from the back-side surface. However, recall that, using prior art methods, the width WB of scribe lines 14-1 had to be particularly large to accommodate the particularly imprecise alignment of saw blade 22. Disadvantageously, forming the scribe lines 14-1 with a relatively large width WB resulted in less integrated circuits for any given size wafer, i.e., a loss of yield. This resulted in a substantial increase in the cost of the integrated circuits.

According to one embodiment of the invention, wafer 510 (FIG. 5) is cut from back-side surface 510B, thus protecting front-side surface 510F of wafer 510 and, more particularly, integrated circuits 512 and 512A. However, advantageously, and in direct contrast to the prior art, back-side singulation according to the invention is preformed by laser beam 323 of laser scribe machine 322 (FIG. 3B). Consequently, width WL of scribe line 514 does not need to be any larger than the width of laser beam 323 plus some minimal tolerance for alignment.

In addition, as discussed above, the tolerance for alignment can be further reduced using the newer methods of alignment set forth in U.S. patent application Ser. No. 09/558,392, entitled "PRECISION MARKING AND SINGULATION METHOD", naming Thomas Glenn et al. as inventors, filed on Apr. 25, 2000 and assigned to the assignee of the present invention, which is incorporated herein by reference. Consequently, using the invention scribe line 514 typically has a width WL between 0.0005 inches (0.013 mm) and 0.001 inches (0.026 mm).

This is in stark contrast to the prior art methods of back-side cutting which required scribe lines 14-1 with widths WB of at least 0.012 inches (0.305 mm), and often even larger (FIG. 2). As a result, using the invention, width WL of scribe line 514 is on the order of twenty-four times smaller than the width WB of scribe lines 14-1 in the prior art; a 2400% decrease.

Figure 6:
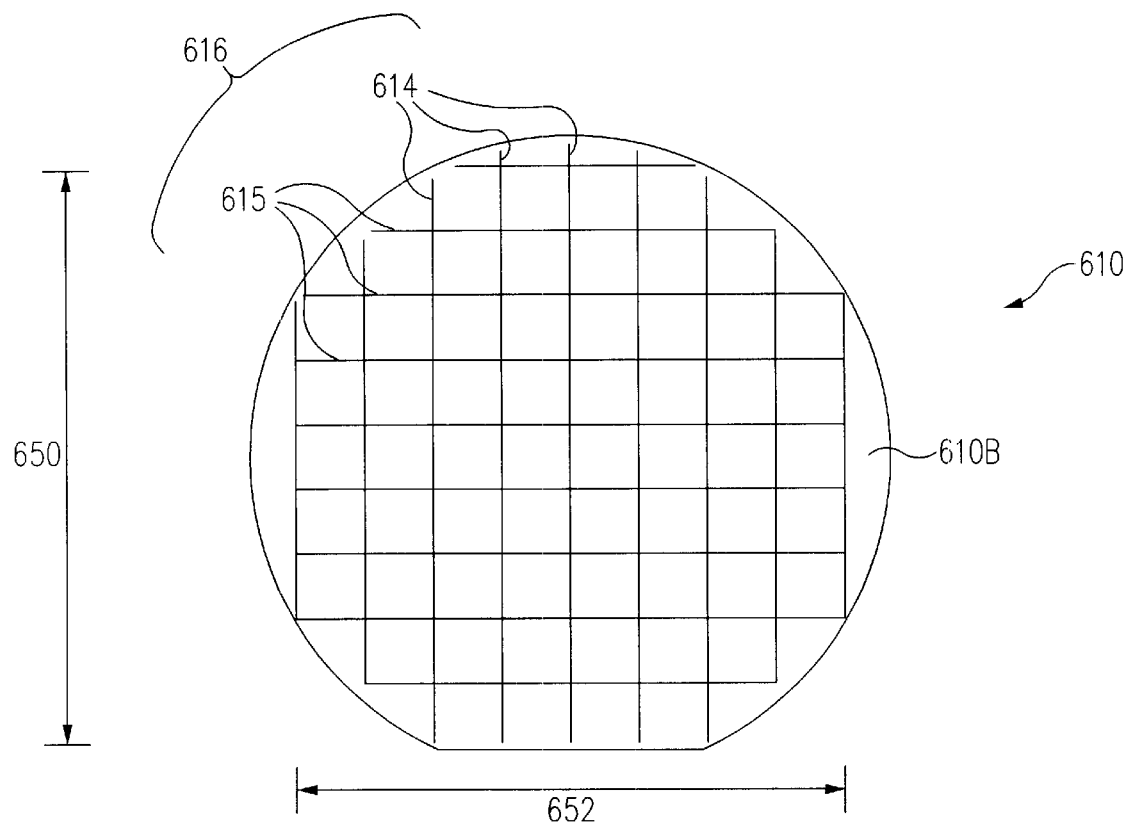
FIG. 6 shows a trench grid on a back-side surface of a wafer including horizontal trenches and vertical trenches that lie beneath the horizontal scribe lines and vertical scribe lines that define individual integrated circuits, according to the principles of the invention.

FIG. 6 shows a wafer 610 including trench grid 616 formed according to the invention on a back-side surface 610B of a wafer 610 including a plurality of horizontal trenches 615 and a plurality vertical trenches 614 that lie beneath horizontal scribe lines 315 and vertical scribe lines 314 that define individual integrated circuits 312 on frontside surface 310F (FIG. 3A). Horizontal trenches 615 and vertical trenches 614 are formed in accordance with the discussion above regarding FIG. 3B and FIG. 4 or FIG. 5 and run the entire usable width 652 and usable length 650, respectively, of wafer 610 thereby delineating individual integrated circuits 612.

As discussed above, using prior art methods of back-side singulation, scribe lines had to have widths large enough to accommodate: the width of saw blade; the inexact positioning and alignment of saw blade; the mechanical wobbling of saw blade; and the uneven or rough surfaces resulting from the mechanical nature of cutting using a saw blade. As also discussed above, forming the scribe lines with a relatively large widths resulted in less integrated circuits for any given size wafer, i.e., a loss of yield. This resulted in a substantial increase in the cost of the integrated circuits.

As shown above, according to one embodiment of the invention, a wafer is cut from back-side surface, thus protecting the front-side surface of the wafer and, more particularly, the integrated circuits. However, advantageously, and in direct contrast to the prior art, back-side singulation according to the invention is preformed by a laser. Consequently, according to the invention, no saw blade is used and the width of the scribe lines does not need to be large enough to accommodate: the width of saw blade; the inexact positioning and alignment of saw blade; the mechanical wobbling of saw blade; and the uneven or rough cutting surfaces left by saw blade. Stated another way, using the invention, the width of the scribe lines does not need to be any larger than the width of the beam from the laser plus some minimal tolerance for alignment.

In addition, as discussed above, the tolerance for alignment can be further reduced using the newer methods of alignment set forth in U.S. patent application Ser. No. 09/558,392, entitled "PRECISION MARKING AND SINGULATION METHOD", naming Thomas Glenn et al. as inventors, filed on Apr. 25, 2000 and assigned to the assignee of the present invention, which is incorporated herein by reference. Consequently, using the invention scribe lines typically have widths between 0.0005 inches (0.013 mm) and 0.001 inches (0.026 mm).

This is in stark contrast to the prior art methods of back-side cutting which required scribe lines with widths of at least 0.012 inches (0.305 mm), and often even larger. As a result, using the invention, the width of scribe lines is on the order of twenty-four times smaller than the width of scribe lines required by the prior art methods; a 2400% decrease. Therefore, using the invention, the wafer is cut from back-side surface and the integrated circuits of wafer are protected during singulation. At the same time, there is minimal waste of wafer and the cost per integrated circuit is significantly lower than of the cost per integrated circuit using prior art back-side singulation methods.

Equally impressive is the fact that, using the present invention, the width of the scribe lines is six to fourteen times smaller than the width of the scribe lines required using prior art front-side singulation methods. Consequently, the invention is well suited to front-side singulation and represents a significant improvement over prior art front-side singulation methods as well.

In addition, unlike the prior art front-side and back-side sigulation processes, the method and structure of the invention does not require cutting completely through the wafer to singulate the integrated circuits. Consequently, each integrated circuit can be further processed, shipped and wrapped in a wafer array, thus driving down the cost of each integrated circuit, decreasing the probability of defective units, by decreasing handling operations, and driving up the efficiency of the process.

This application is related to: Glenn et al., commonly assigned U.S. patent application Ser. No. 09/558,397, entitled "PRECISION ALIGNED AND MARKED STRUCTURE", filed Apr. 25, 2000; Glenn et al., commonly assigned U.S. patent application Ser. No. 09/558,392, entitled "PRECISION MARKING AND SINGULATION METHOD", filed Apr. 25, 2000; Glenn et al., commonly assigned and co-filed U.S. patent application Ser. No. 09/xxx, xxx, entitled "STRUCTURE INCLUDING ELECTRONIC COMPONENTS SINGULATED USING LASER CUTTING", all of which are herein incorporated by reference in their entirety.

The drawings and the forgoing description gave examples of the present invention. The scope of the present invention, however, is by no means limited by these specific examples. Numerous variations, whether explicitly given in the specification or not, such as differences in structure, dimension, and use of material, are possible.

For example, the discussion above was directed, in large part, to embodiments of the invention that used back-side singulation. However, those of skill in the art will readily recognize that, with little or no modification, the methods of the invention discussed above can easily be applied to front-side singuation. Back-side sigulation was therefore chosen by way of example only and the scope of the invention is at least as broad as given by the following claims.

What is claimed is:

1. A method comprising:
   providing a substrate, said substrate comprising a substrate first surface and a substrate second surface, opposite said substrate first surface, and a substrate thickness between said substrate first surface and said substrate second surface;
   forming a scribe line on said substrate first surface, said scribe line comprising a scribe line width extending in a first direction on said substrate first surface and a scribe line length extending in a second direction, perpendicular to said first direction, on said substrate first surface, said scribe line further comprising a scribe line depth extending into said substrate first surface and a scribe line bottom surface, said scribe line delineating a first region of said substrate from a second region of said substrate on said substrate first surface;
   forming a reflective layer on said scribe line bottom surface;
   aligning a laser scribe machine on said substrate second surface such that a laser beam from said laser scribe machine is aligned on said substrate second surface with said scribe line on said substrate first surface;
   ablating a portion of said substrate from said substrate second surface using said laser beam, said laser beam ablating said portion of said substrate until said laser beam contacts said reflective layer on said scribe line bottom surface and said laser beam light is reflected from said reflective layer on said scribe line bottom surface;
   removing power to said laser beam when said laser beam light is reflected from said reflective layer on said scribe line bottom surface, thereby ceasing the ablation of said substrate;
   wherein said ablation of said portion of said substrate creates a trench in said substrate second surface, said trench comprising:
     a trench opening at said substrate second surface, said trench opening comprising a trench opening width extending in said first direction along said substrate second surface;
     a trench depth extending from said trench opening to a trench bottom, said trench bottom comprising a portion of said reflective layer on said scribe line bottom surface, said trench bottom comprising a trench bottom width extending in said first direction at said reflective layer of said scribe line bottom surface;
     first and second trench sides extending from said trench opening to said trench bottom; and
     a trench length extending in said second direction on said substrate second surface and being at least partially coextensive with said scribe line length on said substrate first surface such that said trench is positioned below said scribe line within said substrate and said trench delineates said first region of said substrate from said second region of said substrate on said substrate second surface; and
   singulating said first region of said substrate from said second region of said substrate along said trench.

2. The method of claim 1, wherein said substrate thickness is in the range of approximately twenty to thirty mils and said trench depth is in the range of approximately ten to fifteen thousand angstroms less than twenty to thirty mils.

3. The method of claim 2, wherein said trench opening width is larger than said trench bottom width such that said trench first and second sides extend from said trench opening to said trench bottom at an angle to a line perpendicular to said second surface of said substrate.

4. The method of claim 3, wherein said angle is in the range of approximately one to five degrees.

5. The method of claim 1, wherein said substrate further comprises:
   functional components formed on said first surface of said substrate.

6. The method of claim 5, wherein said functional components comprise integrated circuits formed on said first surface of said substrate.

7. The method of claim 5, wherein said functional components comprise micro-machine elements.

8. A method comprising:
   providing a substrate, said substrate comprising a substrate first surface and a substrate second surface, opposite said substrate first surface, and a substrate thickness between said substrate first surface and said substrate second surface;
   forming a scribe line on said substrate first surface, said scribe line comprising a scribe line width of between 0.0005 inches (0.013 mm) and 0.002 inches (0.052 mm) extending in a first direction on said substrate first surface and a scribe line length extending in a second direction, perpendicular to said first direction, on said substrate first surface, said scribe line further comprising a scribe line depth extending into said substrate first surface and a scribe line bottom surface, said scribe line delineating a first region of said substrate from a second region of said substrate on said substrate first surface;
   forming a reflective layer on said scribe line bottom surface;
   aligning a laser scribe machine on said substrate second surface such that a laser beam from said laser scribe machine is aligned on said substrate second surface with said scribe line on said substrate first surface, said laser scribe machine comprising a sensor for sensing reflected laser light from said laser beam;
   ablating a portion of said substrate from said substrate second surface using said laser beam, said laser beam ablating said portion of said substrate until said laser beam contacts said reflective layer on said scribe line bottom surface and said laser beam light is reflected from said reflective layer on said scribe line bottom surface;

removing power to said laser beam when said laser beam light is reflected from said reflective layer on said scribe line bottom surface and is sensed by said sensor, thereby ceasing the ablation of said substrate;

wherein said ablation of said portion of said substrate creates a trench in said substrate second surface, said trench comprising;
- a trench opening at said substrate second surface, said trench opening comprising a trench opening width extending in said first direction along said substrate second surface;
- a trench depth extending from said trench opening to a trench bottom, said trench bottom comprising a portion of said reflective layer on said scribe line bottom surface, said trench bottom comprising a trench bottom width extending in said first direction at said reflective layer of said scribe line bottom surface;
- first and second trench sides extending from said trench opening to said trench bottom wherein said trench opening width is larger than said trench bottom width such that said trench first and second sides extend from said trench opening to said trench bottom at an angle in the range of approximately one to five degrees to a line perpendicular to said second surface of said substrate; and
- a trench length extending in said second direction on said substrate second surface and being at least partially coextensive with said scribe line length on said substrate first surface such that said trench is positioned below said scribe line within said substrate and said trench delineates said first region of said substrate from said second region of said substrate on said substrate second surface; and singulating said first region of said substrate from said second region of said substrate along said trench.

* * * * *